US009595806B2

(12) United States Patent
Tazawa et al.

(10) Patent No.: US 9,595,806 B2
(45) Date of Patent: Mar. 14, 2017

(54) LASER LIGHT-EMITTING APPARATUS

(71) Applicant: Stanley Electric Co., Ltd., Tokyo (JP)

(72) Inventors: Komei Tazawa, Tokyo (JP); Tatsuma Saito, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 15/059,482

(22) Filed: Mar. 3, 2016

(65) Prior Publication Data

US 2016/0268770 A1    Sep. 15, 2016

(30) Foreign Application Priority Data

Mar. 9, 2015   (JP) ................ 2015-045859

(51) Int. Cl.

| H01S 3/10 | (2006.01) |
|---|---|
| H01S 5/022 | (2006.01) |
| H01S 5/06 | (2006.01) |
| H01S 5/00 | (2006.01) |
| H01S 5/042 | (2006.01) |

(Continued)

(52) U.S. Cl.
CPC ........ H01S 5/02276 (2013.01); H01S 5/0092 (2013.01); H01S 5/022 (2013.01); H01S 5/024 (2013.01); H01S 5/02208 (2013.01); H01S 5/02216 (2013.01); H01S 5/0425 (2013.01); H01S 5/0604 (2013.01); H01S 5/02236 (2013.01); H01S 5/02296 (2013.01); H01S 5/02469 (2013.01); H01S 5/32341 (2013.01)

(58) Field of Classification Search
CPC ............. H01S 5/02208; H01S 5/02236; H01S 5/02469; H01S 5/024; H01S 5/022; H01S 5/0092; H01S 5/0604; H01S 5/0425
USPC ........................................................ 372/21
See application file for complete search history.

(56) References Cited

U.S. PATENT DOCUMENTS

| 8,115,106 B2 | 2/2012 | Tanaka et al. |
| 8,373,182 B2 | 2/2013 | Seko et al. |
| (Continued) | | |

FOREIGN PATENT DOCUMENTS

| JP | 8-228045 A | 9/1996 |
| JP | 2003-282952 A | 10/2003 |
| (Continued) | | |

*Primary Examiner* — Kinam Park
(74) *Attorney, Agent, or Firm* — Kenealy Vaidya LLP

(57) ABSTRACT

The disclosed subject matter relates to a reliable laser light-emitting apparatus. The laser light-emitting apparatus can include a laser chip, which is sealed by a first base board having an opening, a second base board and a wavelength converting board. The wavelength converting board can be attached between the first base board and the second base board so as to be located between the opening and the laser chip. A laser beam emitted from the laser chip can be emitted from the opening via the wavelength converting board, and heats generated from the laser chip and the wavelength converting board can efficiently radiate from the first base board and the first base board. Thus, the disclosed subject matter can provide reliable semiconductor light-emitting apparatuses, which can emit various color lights having favorable optical characteristics and which can be used for lighting units such as a headlight under the tough environments.

10 Claims, 12 Drawing Sheets

(51) Int. Cl.
  *H01S 5/024*  (2006.01)
  *H01S 5/323*  (2006.01)

(56) References Cited

U.S. PATENT DOCUMENTS

| | | | |
|---|---|---|---|
| 8,860,061 B2* | 10/2014 | Kotani | H01L 33/54 257/88 |
| 9,076,952 B2 | 7/2015 | Saito et al. | |
| 9,147,814 B2 | 9/2015 | Waragaya | |
| 2007/0195538 A1* | 8/2007 | Hama | G02B 6/0003 362/382 |
| 2014/0197445 A1 | 7/2014 | Saito et al. | |
| 2014/0321151 A1* | 10/2014 | Sato | H01S 5/02284 362/553 |
| 2015/0372200 A1* | 12/2015 | Seko | F21S 48/125 362/510 |

FOREIGN PATENT DOCUMENTS

| | | |
|---|---|---|
| JP | 2007-188059 A | 7/2007 |
| JP | 2008-294259 A | 12/2008 |
| JP | 2010-165834 A | 7/2010 |
| JP | 2013-109928 A | 6/2013 |
| JP | 2013-196818 A | 9/2013 |

\* cited by examiner

LASER LIGHT-EMITTING APPARATUS

This application claims the priority benefit under 35 U.S.C. §119 of Japanese Patent Application No. 2015-045859 filed on Mar. 9, 2015, which is hereby incorporated in its entirety by reference.

BACKGROUND

1. Field

The presently disclosed subject matter relates to laser light-emitting apparatuses, in which a laser beam emitted from a laser chip is wavelength-converted by a wavelength converting board, and more particularly relates to reliable laser light-emitting apparatuses having favorable optical characteristics and a high workability, which can be used for various lighting units such as a vehicle headlight and the like with a simple structure.

2. Description of the Related Art

Laser light-emitting apparatuses, in which a part of a laser beam emitted from a laser chip is converted into light having a different wavelength by a wavelength converting layer and in which a mixture light including the light having the different wavelength mixed with the laser beam emitted directly from the laser chip is emitted, have been used as a light source for various lighting units. In this case, laser light-emitting apparatuses, in which the laser chip may be located at a desired position by using an optical fiber, have also been known.

A first conventional laser light-emitting device, which may be used for such a laser light-emitting apparatus, is disclosed in Patent Document No. 1 (Japanese Patent Application Laid Open H08-228045). FIG. 9a is a schematic enlarged perspective view showing a first conventional laser light-emitting device, and FIG. 9b is a schematic enlarged cross-sectional view taken along Line A-A shown in FIG. 9a showing the first conventional laser light-emitting device, which is disclosed in Patent Document No. 1.

The first conventional laser light-emitting device 60 includes: a first sub mount 66 having a cavity located between a first top surface and a second top surface thereof; a first external electrode 64a formed on the first top surface of the first sub mount 66; a second external electrode 64b formed a bottom surface of the cavity of the first sub mount 66; a third external electrode 64c formed on the second top surface of the sub mount 66; a laser chip 67 mounted on the second external electrode 64b via a first solder 68; a heat sink 61 attaching the first sub mount 66 along with the laser chip 67 via a second solder 62; and a second sub mount 63 connecting to the first electrode 64a, the third external electrode 64c and the laser chip 67 via a third solder 65.

Accordingly, the conventional laser light-emitting device 60 may emit a laser beam emitted from the laser chip 67 toward the cavity of the first sub mount 66 so that the laser beam passes though the cavity. In this case, the conventional device 60 may radiate a heat directed toward the first sub mount 66 in heats generated from the laser chip 67 from the heat sink 61 via the second solder 62, and also may radiate a directed toward the second sub mount 63 in the heats from the second sub mount 63 via the third solder 65. However, when the conventional device 60 is used as a light source for a vehicle headlight and the like, which must be used under tough environments, because the laser chip 67 is not sealed by the first sub mount 66 and the second sub mount 63 and is exposed from the cavity, the conventional laser light-emitting device 60 may have concerns about a reliability under the tough environments.

A second conventional laser light-emitting device using a sealed laser chip, which may be used for a laser light-emitting apparatus including an optical fiber, is disclosed in Patent Document No. 2 (Japanese Patent Application Laid Open 2008-294259). FIG. 10a is a schematic enlarged cross-sectional front view showing a second conventional laser light-emitting device, and FIG. 10b is a schematic enlarged bottom view showing the second conventional laser light-emitting device, which is disclosed in Patent Document No. 2.

The second conventional laser light-emitting device 70 includes: a stem 74; a laser chip 73 mounted in a can-package, which is mounted on the stem 74; a lens holder 78 covering the can-package on the stem 74, and including an optical lens 76, which passes thought a laser beam emitted from the laser chip 73; a base board 71 having fixing openings 72 and a screw opening 77 attaching the stem 74 along with the laser chip 74 and the lens holder 78 using a fixing screw 79, which screws in the screw opening 77 to attach the stem 74 to the base board 71; a fiber holder 80a attached to the lens holder 78, and attaching a fiber sleeve 80b; an optical fiber module 82 attached into the fiver sleeve 80b; and a protecting cover 81 covering the fiber holder 80a and the fiver sleeve 80b, and holding the optical fiber module 82.

Hence, the second conventional laser light-emitting device 70 may emit a laser beam emitted from the laser chip 73 toward the optical fiber module 82 via the optical lens 76 so that the laser beam passes into an optical fiber in the optical fiber module 82. However, although the laser chip 73 may be sealed by the can-package, the conventional device 70 may not be necessarily radiate a heat generated from the laser chip 73 efficiently, because the laser chip 73 is mounted on a mounting surface in the sealed can-package. Additionally, neither the first conventional device 60 nor the second conventional device 70 include a wavelength converting material, and therefore may emit different color lights from each of the laser beams for the laser chips 67 and 73.

Therefore, Applicant of this disclosed subject matter discloses a reliable laser light-emitting apparatus using a can-typed laser chip, which may emit various color lights at a high radiating efficiency in Patent document No. 3 (U.S. Patent Publication No. 2015/0372200 A1), and also discloses a laser light-emitting apparatus using a sealed laser chip and an optical fiber, which may emit various color lights at a high reliability and which can be used as a light source for a headlight and the like in Patent document No. 4 (U.S. patent application Ser. No. 14/951,609). Additionally, Applicant of this disclosed subject matter discloses reliable laser light-emitting apparatuses having favorable optical characteristics, which can be used for a vehicle headlight and the like with a simple structure in Patent document No. 5 (U.S. patent application Ser. No. 14/937,823).

FIG. 11a is a schematic enlarged top view depicting a conventional laser light-emitting apparatus, and FIG. 11b is a schematic enlarged cross-sectional view taken along Line v-v shown in FIG. 11a depicting the conventional laser light-emitting apparatus, which may emit various color lights including a substantially white color light and which is disclosed in Patent document No. 5.

The conventional laser light-emitting apparatus 90 includes: a holder 93 including a supporter and a fixing frame attached on a base board of a package 92, which surrounds a laser chip LD having an incident surface LD-LS; a converting board holder BD attached into the fixing frame of the holder 93; each of leads 96 being electrically connected to a respective one of electrodes of the laser chip LD; and a wavelength converting board FC formed in a substantially planar shape, and incorporated into the converting board holder BD, wherein a laser optical axis OA of the laser chip LD passes though each of openings of the supporter and the fixing frame of the holder 93, and intersects with the wavelength converting board FC at a substantially right angle.

According to the above-described laser light-emitting apparatus 90, the wavelength converting board FC can receive a laser beam emitted from the incident surface Ld-LS of the laser chip LD, and also can convert a part of the laser beam into light having a different wavelength. Accordingly, the conventional laser light-emitting apparatuses 90 can emit various color lights including a substantially white color light having favorable optical characteristics, which can be used for a vehicle lamp, etc. However, the laser light-emitting apparatus 90 needs a process for connecting each of the leads 96 to the respective one of the electrodes of the laser chip LD, and therefore may not necessarily be an apparatus having a high workability.

The above-referenced Patent Documents are listed below, and are hereby incorporated with their English abstracts in their entireties.
1. Patent Document No. 1: Japanese Patent Application Laid Open H08-228045
2. Patent Document No. 2: Japanese Patent Application Laid Open 2008-294259
3. Patent Document No. 3: U.S. Patent Publication No. 2015/0372200 A1
4. Patent document No. 4: U.S. patent application Ser. No. 14/951,609
5. Patent document No. 5: U.S. patent application Ser. No. 14/937,823

The presently disclosed subject matter has been devised to consider the above and other problems, features, and characteristics in the conventional art devices. Embodiments of the disclosed subject matter can include reliable semiconductor light-emitting apparatuses that can emit mixture lights having favorable optical characteristics such as a high uniform color tone, a high light-emitting intensity and the like, which can be used for a vehicle lamp and the like, and which can also include an optical fiber. Accordingly, the semiconductor light-emitting apparatuses can emit the mixture lights including a substantially white color tone having a high light-emitting intensity from a small opening thereof, which can be used for lighting units such as a vehicle headlight that controls light emitted from the light-emitting apparatus using a reflector and/or a projector lens. The disclosed subject matter can also include providing reliable laser light-emitting apparatuses having a high workability due to a simple structure.

SUMMARY

The presently disclosed subject matter has been devised in view of the above and other problems, features, and characteristics in the conventional art, and to make changes to existing laser light-emitting apparatuses. Thus, an aspect of the disclosed subject matter provides reliable semiconductor light-emitting apparatuses that can emit various color lights including a substantially white color light having favorable optical characteristics and a high workability, which can be used for various lighting units such as a vehicle headlight and the like under tough environments.

According to an aspect of the disclosed subject matter, a laser light-emitting apparatus can include: a laser chip having a light-emitting surface including a top contact material, the top contact material thereof being electrically connected to a second chip electrode thereof, and being exposed from the laser chip in an opposite direction of a first chip electrode thereof; a first base board having a first bottom surface and a cavity made from an insulating material, the cavity connecting an opening thereof, being concaved from a first top surface thereof toward a cavity bottom surface via a cavity side surface, and mounting the laser chip on the cavity bottom surface via a sub mount, and the opening thereof facing the light-emitting surface of the laser chip; a second external electrode extending from the cavity bottom surface toward the first bottom surface, being exposed from the cavity bottom surface, being electrically connected to the first chip electrode of the laser chip via the sub mount, and exposed from the first bottom surface of the first base board; a first external electrode formed in a substantially planar shape on the first top surface of the first base board, and located in an opposite direction of the opening of the first base board; and a contact layer having a substantially same thickness as that of the first external electrode being located adjacent the first external electrode on the first top surface of the first base board, and surrounding the cavity and the opening on the first top surface of the first base board.

In addition, the laser light-emitting apparatus can also include: a second base board having a second side surface including a second electrode underneath a second bottom surface thereof, and the second electrode thereof connecting the top contact material of the laser chip and the first external electrode and the contact layer, which are located on the first top surface of the first base board, and thereby the second base board covering the cavity and at least a part of the opening of the first base board; an inserting concave portion (13R and/or 19R) including at least one of the first base board and the second base board, and located adjacent the cavity and the opening of the first base board; and a wavelength converting board being inserted into the inserting concave portion, which is concave toward the at least one of the first base board and the second base board, the wavelength converting board attached between the first base board and the second base board, and located in substantially parallel with each of the first side surface of the first base board and the second side surface of the second base board, wherein the laser chip is substantially sealed by the wavelength converting board, the first base board and the second base board.

In the above-described exemplary laser light-emitting apparatus, the laser light-emitting apparatus can further include an isolating layer disposed from the bottom contacting material toward the laser chip via the sub mount, located in a direction toward at least the first external electrode on the first base board, and covering at least parts of the laser chip and the sub mount, wherein the light-emitting surface of the laser chip is exposed from the isolating layer, and also can further include a thermal conductive material disposed between the isolating layer and the cavity side surface of the cavity.

In the above-described exemplary semiconductor light-emitting apparatuses, the wavelength converting board can include a phosphor plate formed in a substantially tabular shape and a light-diffusing plate formed in a substantially tabular shape, and wherein an adhesive material is disposed between each of inner peripheral regions of the phosphor plate and the light-diffusing plate and thereby the adhesive material attaching the phosphor plate to the light-diffusing plate on each of the inner peripheral regions, and a wavelength connecting layer is disposed on each of outer peripheral regions of the phosphor plate and the light-diffusing plate, which is located in an opposite direction of each of the inner peripheral regions of the phosphor plate and the light-diffusing plate, respectively. The wavelength converting board can include a phosphor plate formed in a substantially tabular shape and a light-diffusing plate formed in a substantially tabular shape, wherein a multi-contacting-layer is disposed between each of inner peripheral regions of the phosphor plate and the light-diffusing plate and thereby the multi-contacting-layer attaching the phosphor plate to the light-diffusing plate on each of the inner peripheral regions, and a multi-connecting-layer is disposed on each of outer peripheral regions of the phosphor plate and the light-diffusing plate, which is located in an opposite direction of each of the inner peripheral regions of the phosphor plate and the light-diffusing plate, respectively. In this case, the multi-contacting-layer can include a first light-reflecting layer and a first contact-contributing layer, and the multi-connecting-layer can include a second light-reflecting layer and a second contact-contributing layer, and wherein the first light-reflecting layer contacts each of the inner peripheral regions of the phosphor plate and the light-diffusing plate, and the second light-reflecting layer contacts each of the outer peripheral regions of the phosphor plate and the light-diffusing plate. Additionally, the first light-reflecting layer can be a laminated film of titanium (Ti) and silver (Ag), and the first contact-contributing layer can be a laminated film in order of nickel (Ni), platinum (Pt) and gold (Au), and the second light-reflecting layer can also be a laminated film in order of Ti and Ag, and also the second contact-contributing layer can be a laminated film in order of Ni, Pt, Au and gold-tin (AuSn).

Moreover, the phosphor plate of the wavelength converting board can include at least one of an yellow phosphor, a red phosphor, a green phosphor and a blue phosphor. A semiconductor laser diode emitting blue light can be used as the laser chip, and Yttrium aluminum garnet (YAG) phosphor ceramic can be used as the phosphor plate of the wavelength converting board. Furthermore, the laser chip can be a laser diode emitting ultraviolet laser beam, and the phosphor plate of the wavelength converting board can include at least one of an yellow phosphor, a red phosphor, a green phosphor and a blue phosphor.

According to the above-described exemplary semiconductor light-emitting apparatus, the wavelength converting board can efficiently receive the laser beam emitted from the laser light-emitting surface of the laser chip at a substantially right angle with respect to the wavelength converting board via the light-diffusing plate. Accordingly, the laser light-emitting apparatus can emits the mixture light having favorable optical characteristics such as a high uniform color tone and a high light-emitting intensity. In the case, heats generated from the laser chip and the wavelength converting board can efficiently radiate from the second base board and the first base board, and also the laser chip can be sealed by the first base board, the second base board and the wavelength converting board. Thus, the disclosed subject matter can provide the laser light-emitting apparatuses having the favorable optical characteristics and a high reliability, which can be used for lighting units such as a vehicle headlight under the tough environments.

BRIEF DESCRIPTION OF THE DRAWINGS

These and other characteristics and features of the disclosed subject matter will become clear from the following description with reference to the accompanying drawings, wherein:

FIG. 4 is an enlarged side cross-sectional view showing a wavelength converting board shown in FIG. 3a;

FIG. 7 is an enlarged side cross-sectional view showing a third exemplary variation of the laser light-emitting apparatus shown in FIG. 1, wherein the third variation relates to the wavelength converting board shown in FIG. 3a;

FIG. 10b is a schematic enlarged bottom view showing the second conventional laser light-emitting device of FIG. 10a.

DETAILED DESCRIPTION OF EXEMPLARY EMBODIMENTS

Figure 1:
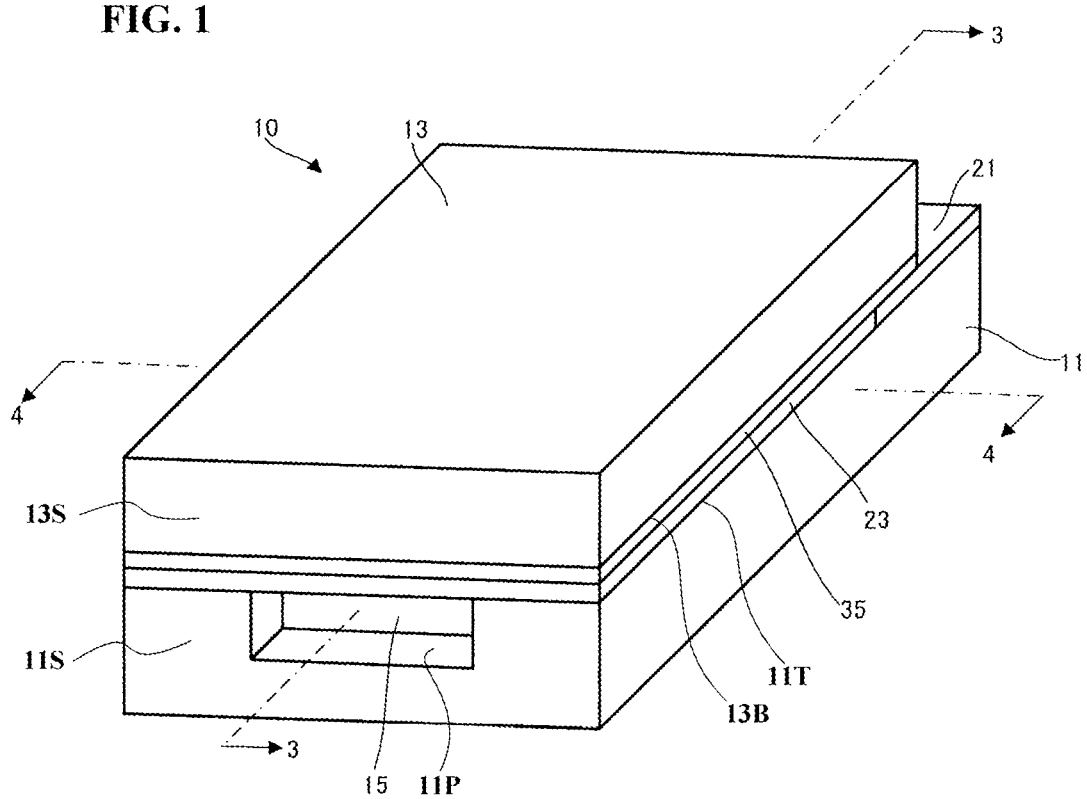
FIG. 1 is an enlarged perspective view showing an exemplary embodiment of a laser light-emitting apparatus made in accordance with principles of the disclosed subject matter.

Exemplary embodiments of the disclosed subject matter will now be described in detail with reference to FIG. 1 to FIG. 8, in which the same or corresponding elements use the same reference marks. FIG. 1 is an enlarged perspective view showing an exemplary embodiment of a laser light-emitting apparatus made in accordance with principles of the disclosed subject matter.

The laser light-emitting apparatus 10 can include a first base board 11 having a first top surface 11T and a first side surface 11S formed in a substantially planar shape and an opening 11P, the first base board 11 also formed in a substantially rectangular shape when it viewed from a direction of the first top surface 11T, and the first base board 11 including a first external electrode 21 having a first thickness, which is located on the first top surface 11T; a second base board 13 having a second bottom surface 13B and a second side surface 13 formed in a substantially planar shape, and the second base board 13 including a second electrode 35, which is located underneath the second bottom surface 13B and connects to the first external electrode 21 located on the first top surface 11T of the first base board 11;

and a contact layer 23 having a substantially same thickness as the first thickness of the first external electrode 21 located between the first top surface 11T of the first base board 11 and the second electrode 35 of the second base board 13, and thereby attaching the first base board 11 to the second base board 13 via the second electrode 35 of the second base board 13.

In addition, the laser light-emitting apparatus 10 can also include a wavelength converting board 15 attached between the first base board 11 and the second base board 13 so as to be exposed from the opening 11P of the first base board 11. The wavelength converting board 15 can be located in substantially parallel with each of the first side surface 11S of the first base board 11 and the second side surface 13S of the second base board 13.

In this case, each of the first side surface 11S of the first base board 11 and the second side surface 13S of the second base board 13 can be located on a substantially same surface, and also can be located at a substantially right angle with respect to each of the first top surface 11T and the second bottom surface 13B, while the second electrode 35 of the second base board 13 and the contact layer 23 are located between each of the first side surface 11S of the first base board 11 and the second side surface 13S of the second base board 13.

Figure 2:
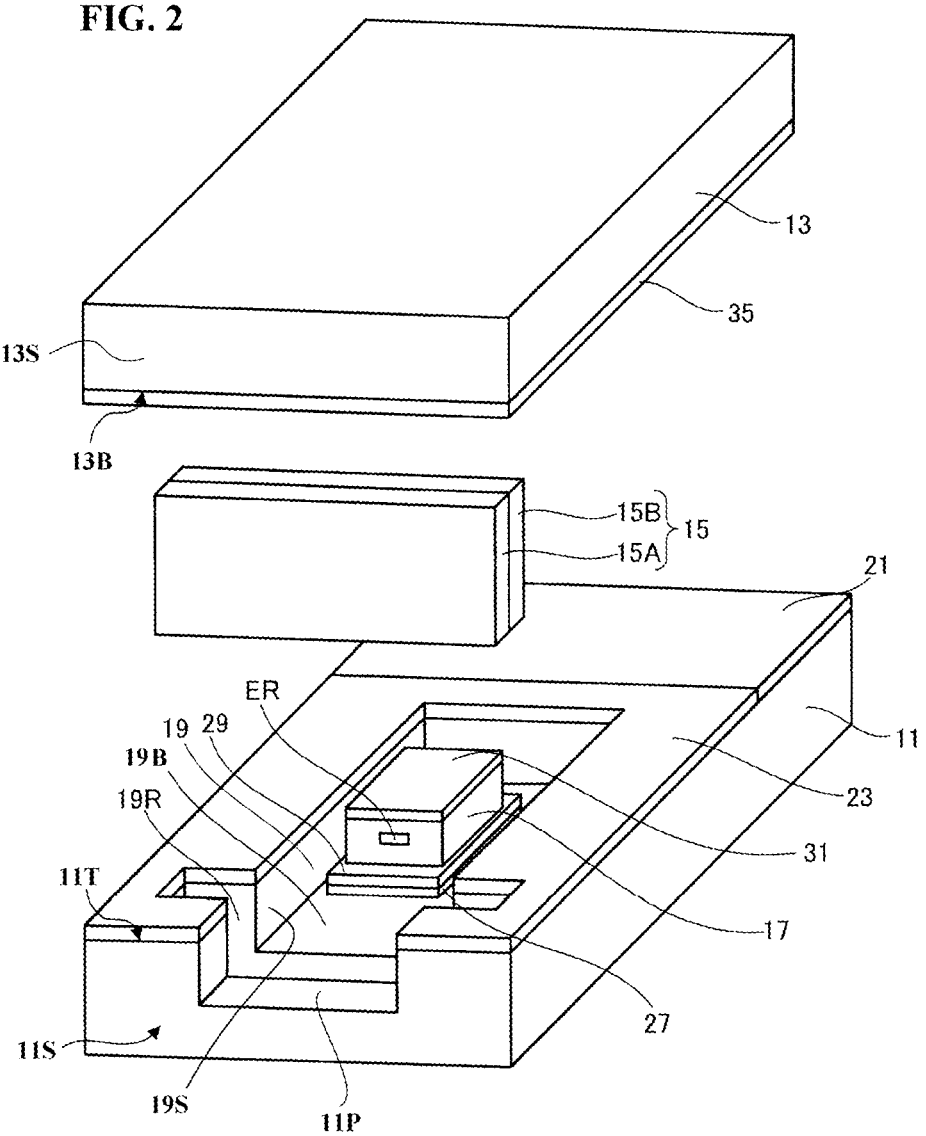
FIG. 2 is an enlarged exploded view showing the laser light-emitting apparatus shown in FIG. 1.

FIG. 2 is an enlarged exploded view showing the laser light-emitting apparatus shown in FIG. 1. The first base board 11 can also include: the first side surface 11S; the opening 11P passing through the first side surface 11S; a cavity 19 having a cavity side surface 19S and a cavity bottom surface 19B formed in a substantially planar shape, and the cavity 19 being concaved from three directions of the first top surface 11T of the first base board 11 toward the cavity bottom surface 19B thereof; and a first inserting concave portion 19R located between the cavity 19 and the opening 11P of the first base board 11, and therefore the cavity 19 continuously connecting to the opening 12P via the first inserting concave portion 19R.

On the cavity bottom surface 19B of the cavity 19, a sub mount 29 can be attached via a bottom contacting material 27, and a laser chip 17 having a light-emitting surface ER can be mounted on the sub mount 29 so that a laser beam emitted from the light-emitting surface ER may be directed toward the opening 11P of the first base board 11. The laser chip 17 can contact the second electrode 35 of the second base board 13 via a top contacting material 31, which is made from an adhesive material having a high thermal conductivity. The wavelength converting board 15 can be inserted into the first inserting concave portion 19R, and also can be attached between the first base board 11 and the second base board 13.

Accordingly, the wavelength converting board 15 can seal the laser chip 17 including the top contact material 31, which is mounted on the cavity bottom surface 19B of the cavity 19 via the sub mount 29, along with the first base board 11 including the contact layer 23 and the second base board 13 including the second electrode 35. Additionally, the wavelength converting board 15 can include a phosphor plate 15A and a light-diffusing plate 15B, and therefore can wavelength-convert a part of the laser beam emitted from the laser diode 17. Thus, the laser light-emitting apparatus 10 can emit various color lights from the opening 11P of the first base board 11 by an additive color mixture of an wavelength-converted light excited by the part of the laser beam emitted from the laser diode 17 using the phosphor plate 15A of the wavelength converting board 15 and another direct beam of the laser beam emitted from the laser chip 17.

Further details of the above-described structure of the laser light-emitting apparatus 10 will now be described with reference to FIGS. 3a and 3b, which are enlarged cross-sectional views taken along Line 3-3 and Line 4-4 shown in FIG. 1 showing the laser light-emitting apparatus 10, respectively. The first base board 11 of the laser light-emitting apparatus 10 can be made from an insulating material such as aluminum nitride (AlN), and also the second base board 13 can be made from the insulating material such as AlN, etc.

The first inserting concave portion 19R, into which the wavelength converting board 15 is inserted in addition to a second inserting concave portion 13R, can include a first concave fixing layer 20 in the first base board 11 along with a second concave fixing layer 34 in the second base board 13. Each of the first concave fixing layer 20 and the second concave fixing layer 34 can disposed between the first inserting concave portion 19R and an end portion of the wavelength converting board 15 and between the second inserting concave portion 13R and another end portion of the wavelength converting board 15, respectively, and can attach the wavelength converting board 15 between the first base board 11 and the second base board 13.

In this case, each of the first concave fixing layer 20 and the second concave fixing layer 34 can be an adhesive material having a high thermal conductivity such as a silicon resin, and the adhesive material can include a metallic powder having a high thermal conductivity such as gold (Au) and the like to efficiently radiate a heat generated from the wavelength converting board 15. Each of first side surfaces of the first inserting concave portion 19R and the second inserting concave portion 13R can be located in substantially parallel with the first side surface 11S of the first base board 11 and the second side surface 13S of the second base board 13, respectively.

In addition, respective ones of the first side surfaces of the first inserting concave portion 19R and the second inserting concave portion 13R can be located on each of substantially same surfaces via the opening 11P of the first base board 11, respectively. Thereby, the wavelength converting board 15 can easily be located in substantially parallel with each of the first side surface 11S of the first base board 11 and the second side surface 13S of the second base board 13, and therefore can efficiently receive the laser beam from the laser light-emitting surface ER of the laser chip 17.

The wavelength converting board 15 can be inserted into the first inserting concave portion 19R and the second inserting concave portion 13R along respective ones of first side surfaces of the first concave fixing layer 20 and second side surfaces of the second concave fixing layer 34, and can seal the opening 11P of the first base board 11 using the first inserting concave portion 19R and the second inserting concave portion 13R between the first base board 11 and the second base board 13. When the wavelength converting board 15 receives the laser beam emitted from the light-emitting surface ER of the laser chip 17, and the laser light-emitting apparatus 19 can emit the various color lights from the opening 11P of the first base board 11 as described above.

On the first top surface 11T located in an opposite direction of the opening 11P of the first base board 11, the first external electrode 21 having the first thickness, which is made from a metal having a high electrical conductivity such as gold (Au) and the like, can be formed, and also can be exposed from the first base board 11 so as to be able to receive a power supply. The contact layer 23 can be located adjacent the first external electrode 21 on the first top surface 11T of the first base board 11, and can surround the cavity 19, the first inserting concave portion 19R to insert the wavelength converting board 15 therein and the opening 11P of the first base board 11.

The contact layer 23 can include at least one of Au and tin (Sn), and a thickness of the contact layer 23 can be a substantially same thickness as the first thickness of the first external electrode 21. Thereby, the first external electrode 21 can be easily able to contact the second electrode 35 of the second base board 13, and also the second base board 13 can be attached to the first base board 11 with confidence as described later.

In addition, the first base board 11 can be provided with a thought hole 19H, which extends from the cavity bottom surface 19B of the cavity 19 toward the first bottom surface 11B of the first base board 11 in a middle portion of the cavity 19. A second external electrode 25, which is made from a metal such as Au and the like, can fill into the though hole 19H so as to be able to receive the power supply along with the first external electrode 21 located on the first top surface 11T of the first base board 11.

On the second external electrode 25 exposed from the cavity bottom surface 19B of the cavity 19, the bottom contacting material 27, which may include at least one of Au and Sn, can be disposed, and the sub mount 29, which may be made from an electrical conductive material such as a metallic including at least one of Copper (Cu) and Tungsten (W) and which is formed in a substantially tubular shape, can be disposed on the bottom contacting material 27. The laser chip 17 having a first chip electrode 17E1 and a second chip electrode 17E2 can be mounted on the sub mount 29, and also the light-emitting surface ER of the laser chip 17 can be located in a direction toward the wavelength converting board 15.

The first chip electrode 17E1 can be electrically connected to the second external electrode 25 via the sub mount 29 and the bottom contacting material 27, and also the second chip electrode 17E2 can be electrically connected to the first external electrode 21 exposed from the first base board 11 via the top contacting material 31, which is made from a conductive material such that contains at least one of Au and tin (Sn), and via the second electrode 35, which is disposed underneath the second bottom surface 13B of the second base board 13.

Accordingly, when the power supply is applied between the first external electrode 21 and the second electrode 35, a laser device of the disclosed subject matter, which can include the bottom contacting material 27, the sub mount 29, the laser chip 1 and the top contacting material 31, can emit the laser beam from the light-emitting surface ER thereof toward the wavelength converting board 15. In this case, the top contacting material 31, which is made from a metal having a high thermal conductivity such as Au and the like, can also be formed on at least the second chip electrode 17E2, and can be connected between the second electrode 35 and the laser chip 17 by eutectic bonding method using gold-tin (AuSn), etc.

In addition, in order to improve a reliability of the laser chip 17, an isolating layer 33, which is made from an isolating material such as silicone oxide ($SiO_2$), can also be disposed from a top contacting surface of the bottom contacting material 27 toward a laser side surface of the laser chip 17 via a sub side surface and a sub top surface of the sub mount 29, which are located in a direction toward at least the first external electrode 21 on the first base board 11 so that the light-emitting surface ER of the laser chip 17 is exposed from the isolating layer 33.

The laser chip 17 having the first chip electrode 17E1 and the second chip electrode 17E2 can connect to the second base board 13 via the top contacting material 31 and the second electrode 35, which are made from the conductive materials each having a high thermal conductivity, and also can connect to the first base board 11 via the sub mount 29 and the bottom contacting material 27, which are made from the conductive materials each having a high thermal conductivity. Therefore, the laser device can efficiently radiate the heat developed from the laser chip 17 from both the first base board 11 and the second base board 13 while maintaining at a high reliability.

Figure 4:
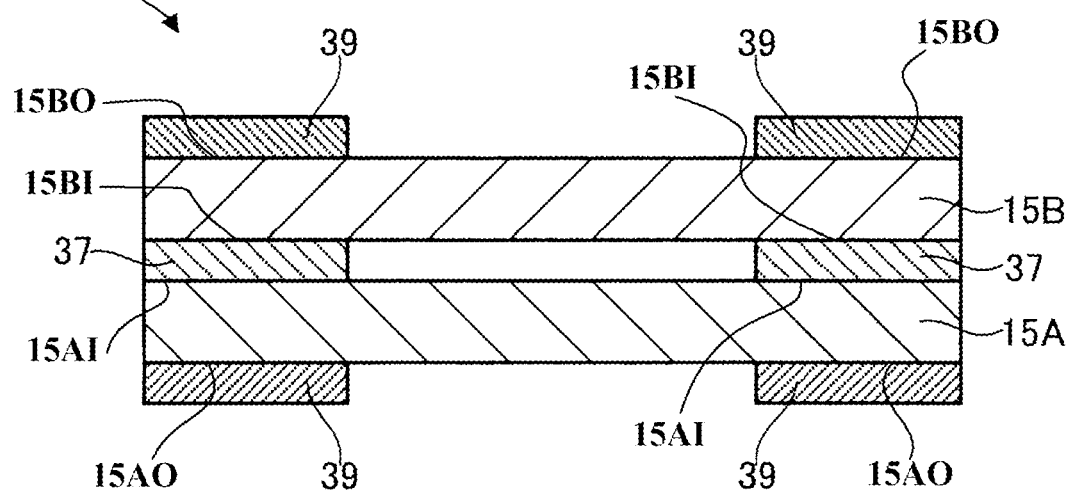

Next, the wavelength converting board 15 will now described in detail with reference to FIG. 4. The wavelength converting board 15 can include: the phosphor plate 15A formed in a substantially tabular shape; the light-diffusing plate 15B formed in a substantially tabular shape; an adhesive material 37 made from an adhesive resin such as an epoxy resin, a silicone resin and the like, disposed between each of inner peripheral regions 15AI and 15BI of the phosphor plate 15A and the light-diffusing plate 15B, which faces with respect to each other, and thereby the adhesive material 37 attaching the phosphor plate 15A to the light-diffusing plate 15B on each of the inner peripheral regions 15AI and 15BI; and a wavelength connecting layer 39 made from AuSn, disposed on each of outer peripheral regions 15AO and 15BO of the phosphor plate 15A and the light-diffusing plate 15B, which is located in an opposite direction of each of the inner peripheral regions 15AI and 15BI of the phosphor plate 15A and the light-diffusing plate 15B, respectively.

The wavelength converting board 15 can be attached between the first inserting concave portion 19R including the first concave fixing layer 20 and the second inserting concave portion 13R including the second concave portion 34 with the eutectic bonding of AuSn by heating the wavelength connecting layer 39. Accordingly, even when a dimension error between the wavelength converting board 15 and each of the first inserting concave portion 19R including the first concave fixing layer 20 and the second inserting concave portion 13R including the second concave portion 34 occurs, the wavelength converting board 15 can be cohered between the first inserting concave portion 19R including the first concave fixing layer 20 and the second inserting concave portion 13R including the second concave portion 34 without any space.

When the laser chip 17 is a blue laser chip(s) having a peak wavelength of approximately 450 nanometers, for example, which is configured with InGaN series material, and when the wavelength converting board 15 includes a yellow phosphor such as Yttrium aluminum garnet (YAG: $Y_3Al_{15}O_{12}:Ce^{3+}$) in the phosphor plate 15A, the yellow phosphor can emit a yellow light upon being excited by a blue laser beam emitted from the blue laser chip after diffusing the blue laser beam in the diffusing plate 15B. Accordingly, the laser light-emitting apparatus 10 can emit substantially white light having a high uniformity by an additive color mixture of the excited yellow light emitted from the yellow phosphor contained in the wavelength converting board 15 and a part of the blue laser beam emitted from the blue laser chip.

When the laser chip 17 is a laser diode, for example, a laser diode of InGaN series that emits an ultraviolet laser beam light having a light-emitting wavelength of approximately 380 nanometers, and when the wavelength converting board 15 includes at least one of a red phosphor wavelength-converting the ultraviolet laser beam into red light, a green phosphor wavelength-converting the ultraviolet laser beam into green light and a blue phosphor wavelength-converting the ultraviolet laser beam into blue light in the phosphor plate 15A, the laser light-emitting apparatus 10 can emit various colored lights including a substantially white light by an additive color mixture in accordance with a ratio of the above-described three color phosphors.

The phosphor plate 15A can be made by forming a binder including at least one of the above-described phosphors in a planar shape, and also can be made by using a ceramic plate. Specifically, a YAG phosphor ceramic, which is made by press-sintering a phosphor material dispersing the YAG phosphor into aluminum oxide, can be used. Detail descriptions with respect to the phosphor plate 15A are disclosed in patent document No. 3 by Applicant of this disclosed subject matter. Accordingly, the detail descriptions are abbreviated here. As the diffusing plate 15B, a plate made by mixing aluminum oxide ($Al_2O_3$) particle as a diffusing material with a glass, a transparent resin and the like can be used.

According to the above-described structure, the wavelength converting board 15 can be located at a substantially right angle with respect to the cavity bottom surface 19 of the first base board 11, and therefore can also receive the laser beam emitted from the laser light-emitting surface ER of the laser chip 17 at a substantially right angle with respect to the wavelength converting board 15. The laser beam can be diffused by the light-diffusing plate 15B, and can be entered into the phosphor plate 15A. Therefore, the laser light-emitting apparatus 10 can emits the mixture light including a substantially white color light having favorable optical characteristics such as a high uniform color tone, a high light-emitting intensity, a small light-emitting spot, which can be used for lighting units such as a vehicle headlight that controls light emitted from the laser light-emitting apparatus 10 using a reflector and/or a projector lens.

In addition, when the laser beam emitted from the laser chip 17 is very small and when the phosphor plate 15A includes a small kind of the above-described phosphor, because the light-diffusing plate 15B can be removed from the wavelength converting board 15, the wavelength converting board 15 can be configured with only the phosphor plate 15A. Moreover, a case where the light-diffusing plate 15B faces the laser light-emitting surface ER of the laser chip 17 in the embodiment is described. However, the laser light-emitting apparatus of the disclosed subject matter can also include the wavelength converting board 15, in which the phosphor plate 15A faces the laser light-emitting surface ER of the laser chip 17 and the light-diffusing plate 15B is exposed from the opening 11P of the first base board 11, in accordance with a usage thereof.

Here, an exemplary method for manufacturing the laser light-emitting apparatus 10 will now be described with reference to FIG. 5a to FIG. 5d, which show the exemplary method for manufacturing one piece of the laser light-emitting apparatus 10, respectively. However, a plurality of the laser light-emitting apparatuses can be manufactured at once by cutting pluralities of the first and second base boards after manufacturing the pluralities of the first and the second base boards as additionally described later.

Figure 5A:
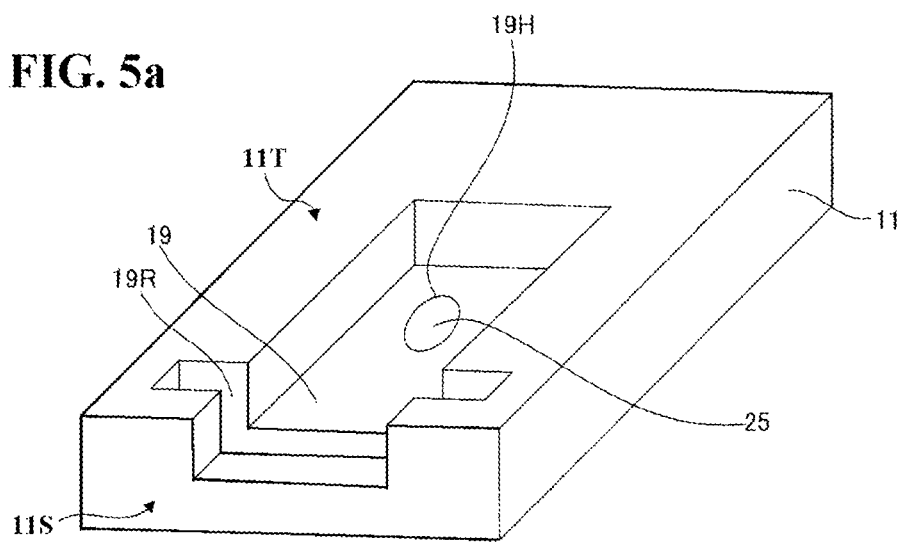
FIGS. 5a to 5d are an enlarged perspective view showing processes (a), (b), (c) and (d) in an exemplary method for manufacturing the laser light-emitting apparatus shown in FIG. 1.

Process (a) is: preparing the first base board 11 formed in the substantially tubular shape; forming the cavity 19, the first inserting concave portion 19R, the opening 11P and the though hole 19H in the first base board 11 using an etching method, a laser processing method, etc.; and forming the second external electrode 25 by filling a metal such as Au in the though hole 19H, as shown in FIG. 5a.

Figure 3A:
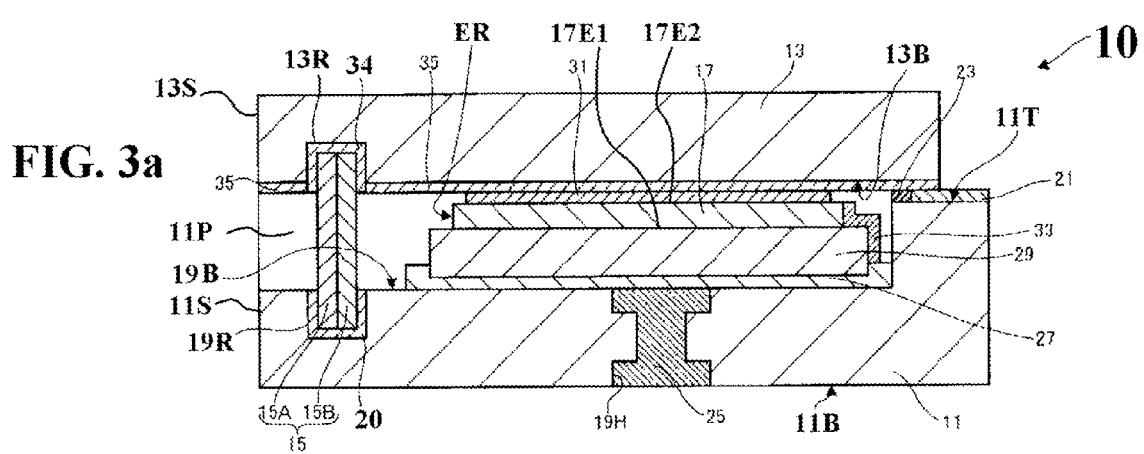
FIGS. 3a and 3b are enlarged cross-sectional views taken along Line 3-3 and Line 4-4 shown in FIG. 1 depicting the laser light-emitting apparatus of FIG. 1, respectively.
Figure 3B:
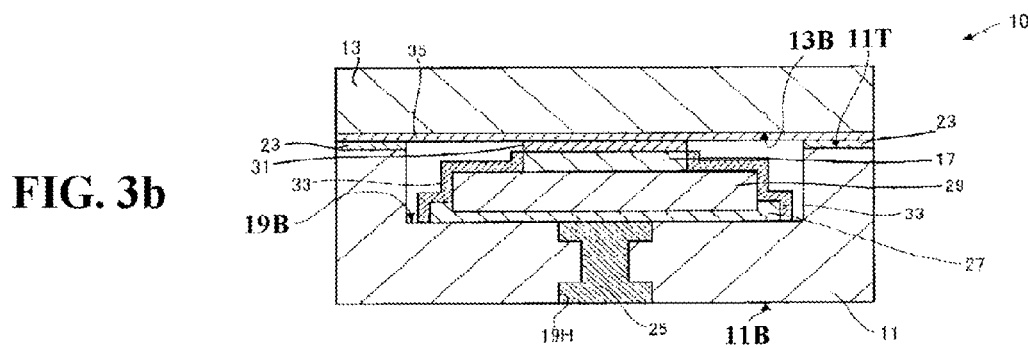
Figure 5B:
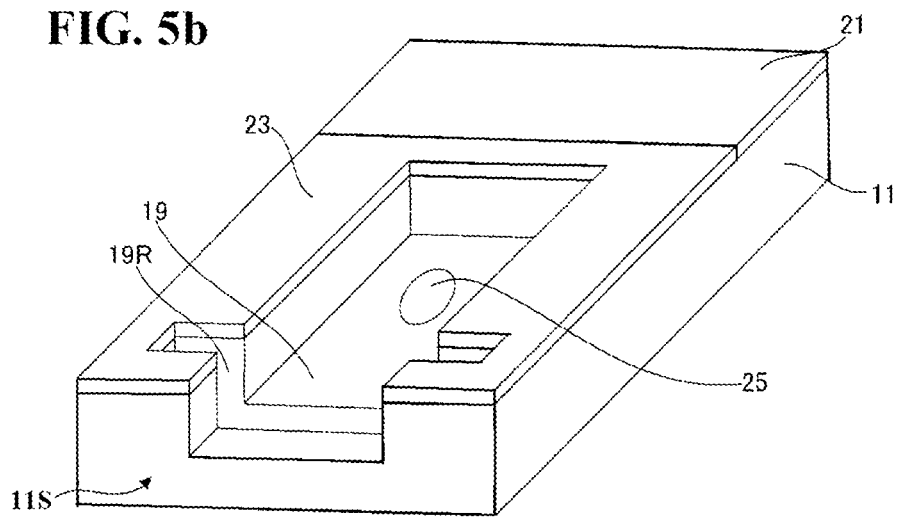

Process (b) is: forming the contact layer 23 around the cavity 19, a metal having a high thermal conductivity such as Au and the like by a vapor-deposited method and the like using the at least one of Au and Sn; forming the first external electrode 21 adjacent the contact layer on the first top surface 11T of the first base board 11 by the vapor-deposited method and the like using the metal having a high electrical conductivity such as gold (Au) and the like; and forming the first concave fixing layer 20 by applying the metal in the first inserting concave portion 19R, as shown in FIG. 5b and FIG. 3a.

When manufacturing the plurality of the laser light-emitting apparatuses at once, the plurality of the laser light-emitting apparatuses can be manufactured at once by singulating the plurality of the first base boards by a dying method and the like after manufacturing the plurality of the first base boards in processes (a) and (b).

Figure 5C:
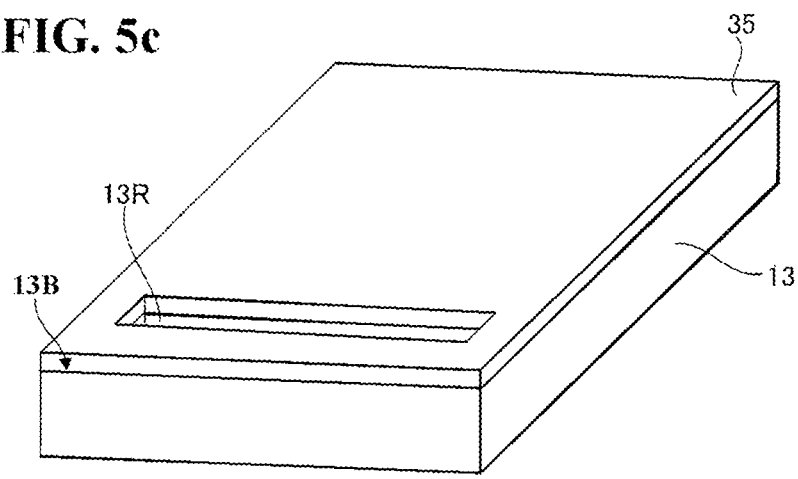

Process (c) is: preparing the second base board 13 formed in the substantially tubular shape; forming the second inserting concave portion 13R in the second base board 13 using an etching method, a laser processing method, etc.; forming the second electrode 35 on the second bottom surface 13B of the second base board 13 by a patterning method and the like using the metal having a high electrical conductivity such as Au; and forming the second concave fixing layer 34 by applying the metal in the second inserting concave portion 13R, as shown in FIG. 5c.

When manufacturing the plurality of the laser light-emitting apparatuses at once, the plurality of the laser light-emitting apparatuses can be manufactured at once by singulating the plurality of the second base boards by the dying method and the like after manufacturing the plurality of the second base boards in process (c).

Figure 5D:
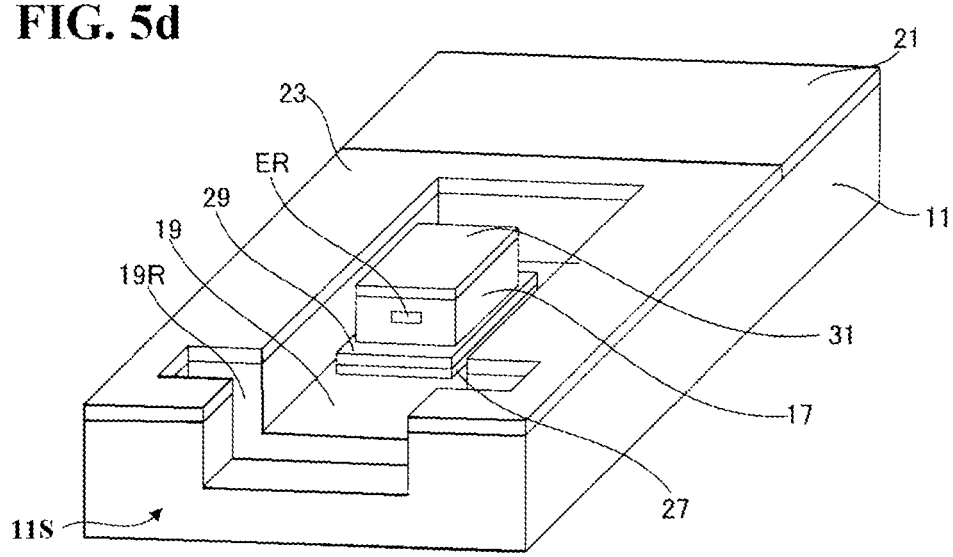

Process (d) is: forming the bottom contacting material 27 by applying a metal having a high electrical conductivity including the at least one of Au and Sn; mounting the sub mount 29, on which the laser chip 17 is mounted, on the bottom contacting material 27 by a heating adhesive method and the like; disposing the isolating layer 33 from the top contacting surface of the bottom contacting material 27 toward the laser side surface of the laser chip 17 via the sub side surface and the sub top surface of the sub mount 29, which are located in a direction toward at least the first external electrode 21 on the first base board 11 so that the light-emitting surface ER of the laser chip 17 is exposed from the isolating layer 33; and forming the top contacting material 31 by applying the metal having a high thermal conductivity such as Au and the like, as shown in FIG. 5d.

Process (e) is: inserting the wavelength converting board 15 into the first inserting concave portion 19R of the first base board 11, as shown in FIG. 2; placing the second base board 13 on the first base board 11 so that the wavelength converting board 15 is inserted into the second inserting concave portion 13R of the second base board 13; and finishing the laser light-emitting apparatus 10 by attaching the second base board to the first base board 11, as shown in FIG. 1.

As described above, the above-described manufacturing method need not to include a wire bonding process for connecting each of the external electrodes to the respective one of the electrodes of the laser chip 17. Each of the first chip electrode 17E1 and the second chip electrode 17E2 of the laser chip 17 can automatically be connected to the first external electrode 21 exposed from the first top surface 11 T of first base board 11 and the second external electrode 25 exposed from the first bottom surface 11B of the first base board 11 in the manufacturing processes. Accordingly, the disclosed subject matter can provide the reliable laser light-emitting apparatuses having favorable optical characteristics and a high workability.

Next, exemplary variations of the laser light-emitting apparatus 10 of the disclosed subject matter will now be described with reference to FIG. 6a to FIG. 8. Differences between each of a first exemplary variation shown in FIG. 6a and a second exemplary variation shown in FIG. 6b and the above-described laser apparatus 10 relate to a fixing structure of the wavelength converting layer 15. Other structures are substantially same as structures of the laser light-emitting apparatus 10, and therefore descriptions of the other structures will be abbreviated.

Figure 6A:
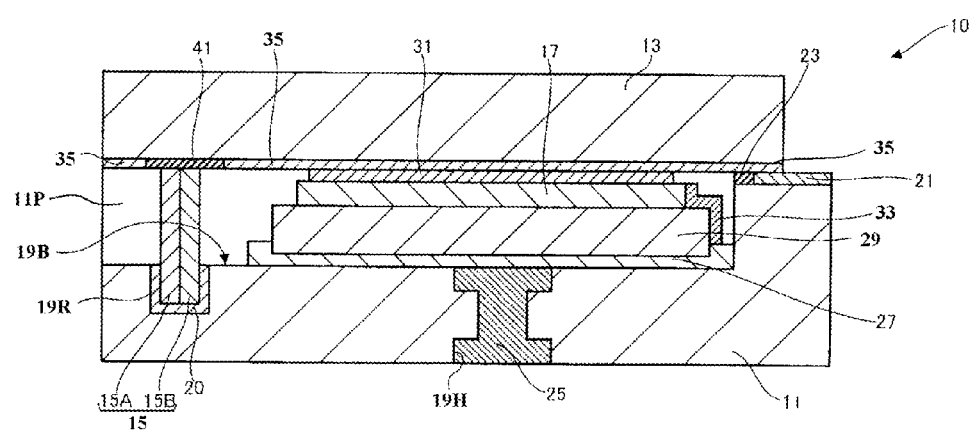
FIGS. 6a and 6b are enlarged cross-sectional views taken along Line 3-3 shown in FIG. 1 depicting a first exemplary variation and a second exemplary variation of the laser light-emitting apparatus shown in FIG. 1, respectively.

The first variation may not include the second inserting concave portion 13R in the second base board 13 to insert the wavelength converting layer 15 and therefore may not also include the second concave fixing layer 34 to attach the wavelength converting layer 15 into the second inserting concave portion 13R as shown in FIG. 6a. In this case, the second inserting concave portion 13R can be replaced with a second planar fixing layer 41, which contacts the wavelength converting layer 15 and which is surrounded by the second electrode located underneath the second bottom surface 13B of the second base board 13. The second planar fixing layer 41 can be made from the metal having a high thermal conductivity such as Au, etc.

When the second base board 13 is attached to the first base board 11 in the first variation, the second base board 13 can be attached to the wavelength converting layer 15 via the second planar fixing layer 41 by eutectic bonding method using AuSn and the like at once, while the top contacting material 31 of the laser chip 17 is attached between the second electrode 35 and the laser chip 17 by eutectic bonding method using AuSn, etc. When the wavelength converting layer 15 is attached to the first base board 11, the wavelength converting layer 15 can be attached into the first inserting concave portion 19R in the first base board 11 via the first concave fixing layer 20 in common with the embodiment of the laser light-emitting apparatus 10 described above.

Therefore, the wavelength converting board 15 can seal the laser chip 17 including the top contact material 31, which is mounted on the cavity bottom surface 19B of the cavity 19 via the sub mount 29, along with the first base board 11 including the contact layer 23 and the second base board 13 including the second electrode 35 in the first variation. Additionally, the laser light-emitting apparatus 10 of the first variation can also emit various color lights including a substantially white light from the opening 11P via the wavelength converting board 15 including the phosphor plate 15A and the light-diffusing plate 15B.

Figure 6B:
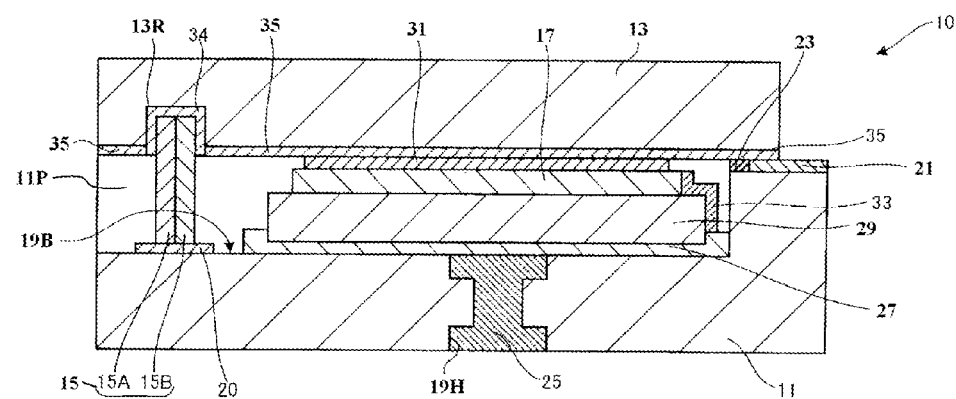

In the second variation shown in FIG. 6b, the laser light-emitting apparatus 10 can include the second inserting concave portion 13R in the second base board 13 to insert the wavelength converting layer 15 and therefore can attach the wavelength converting layer 15 into the second inserting concave portion 13R via the second concave fixing layer 34 in common with the embodiment of the laser light-emitting apparatus 10 described above.

On the other hand, the second variation may not include the first inserting concave portion 19R in the first base board 11, and the cavity bottom surface 19B of the cavity 19 can extend toward the opening 11. The first concave fixing layer 20 can be disposed on the cavity bottom surface 19B of the cavity 19 in a substantially planar shape, which is located under the second inserting concave portion 13R, and can be located between the wavelength converting layer 15 and the cavity bottom surface 19B so as to be able to attach the wavelength converting layer 15 to the first base board 11.

When the second base board 13 is attached to the first base board 11 in the second variation, the second base board 13 can be attached to the wavelength converting layer 15 via the second concave fixing layer 34 by eutectic bonding method using AuSn and the like at once, while the top contacting material 31 of the laser chip 17 is attached between the second electrode 35 and the laser chip 17 by eutectic bonding method using AuSn, etc. When the wavelength converting layer 15 is attached to the first base board 11, the wavelength converting layer 15 can be attached on the cavity bottom surface 19B of the first base board 11 via the first concave fixing layer 20, which is disposed in the substantially planar shape.

Accordingly, the wavelength converting board 15 can seal the laser chip 17 including the top contact material 31, which is mounted on the cavity bottom surface 19B of the cavity 19 via the sub mount 29, along with the first base board 11 including the contact layer 23 and the second base board 13 including the second electrode 35 in the second variation. Additionally, the laser light-emitting apparatus 10 of the second variation can also emit various color lights including a substantially white light from the opening 11P via the wavelength converting board 15 including the phosphor plate 15A and the light-diffusing plate 15B.

Therefore, the disclosed subject matter can provide the reliable semiconductor light-emitting apparatuses with a simple structure, which can emit the mixture lights including the substantially white color tone having a high light-emitting intensity from a small opening 11P and which can be used for lighting units such as a vehicle headlight that controls light emitted from the light-emitting apparatus using a reflector and/or a projector lens, even in the first variation and the second variation of the above-described embodiment.

Figure 7:
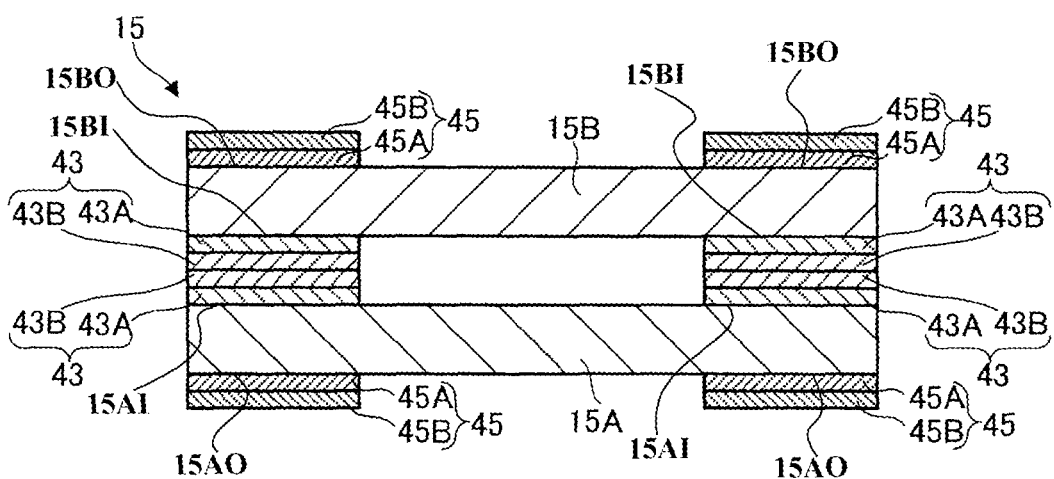

Next, a third exemplary variation of the laser light-emitting apparatus of the disclosed subject matter will now be described with reference to FIG. 7. The third variation relates to the wavelength converting layer 15, and therefore the wavelength converting layer 15 of the third variation and elements associated with the wavelength converting layer 15 will now be described. The wavelength converting board 15 of the above-described embodiment can include: the phosphor plate 15A; the light-diffusing plate 15B; the adhesive material 37 attaching the phosphor plate 15A to the light-diffusing plate 15B; and the wavelength connecting layer 39 made from AuSn, disposed on each of outer peripheral regions 15AO and 15B of the phosphor plate 15A and the light-diffusing plate 15B, respectively, as described above with reference to FIG. 4.

In the third variation to prevent an absolution of light in the wavelength converting board 15 so that the laser light-emitting apparatus 10 can further improve a light-emitting efficiency, a multi-contacting-layer 43 can be replaced with the adhesive material 37, and a multi-connecting-layer 45 can be replaced with the wavelength connecting layer 39. The multi-contacting-layer 43 can be disposed between each of the inner peripheral regions 15AI and 15BI of the phosphor plate 15A and the light-diffusing plate 15B, which faces with respect to each other. The multi-contacting-layer 43 can include a first light-reflecting layer 43A, which is a laminated film of titanium (Ti) and silver (Ag), and can include a first contact-contributing layer 43B, which is a laminated film in order of nickel (Ni), platinum (Pt) and gold (Au).

The multi-connecting-layer 45 can be disposed on each of the outer peripheral regions 15AO and 15BO of the phosphor plate 15A and the light-diffusing plate 15B, which is located in an opposite direction of each of the inner peripheral regions 15AI and 15BI of the phosphor plate 15A and the light-diffusing plate 15B, respectively. The multi-connecting-layer 45 can include a second light-reflecting layer 45A, which is a laminated film in order of Titan (Ti) and Ag, and can include a second contact-contributing layer 45B, which is a laminated film in order of Ni, Pt, Au and AuSn.

Thereby, the phosphor plate 15A and the light-diffusing plate 15B of the wavelength converting board 15 can be connected by a metallic connection of Au—Au with confidence. The wavelength converting board 15 can be connected to each of the first base board 11 and the second base board 13 by eutectic bonding of AuSn via each of the first concave fixing layer 20 in the first concave portion 19R and the second concave fixing layer 34 in the second concave portion 13R, respectively.

In the third variation of the embodiment of the laser light-emitting apparatus 10 described above, the wavelength converting board 15 can include the first light-reflecting layer 43A in the multi-contacting-layer 43 and the second light-reflecting layer 45A in the multi-connecting-layer 45, and therefore can prevent the absolution of light therein because reflecting the laser beam emitted from the laser chip 17 by using the first light-reflecting layer 43A in the multi-contacting-layer 43 and the second light-reflecting layer 45A in the multi-connecting-layer 45. Thus, the laser light-emitting apparatus 10 of the third variation can emit various color lights including the substantially white light from the opening 11P of the first base board 11 at a high light-efficiency via the wavelength converting board 15 including the first light-reflecting layer 43A and the second light-reflecting layer 45A.

Figure 8:
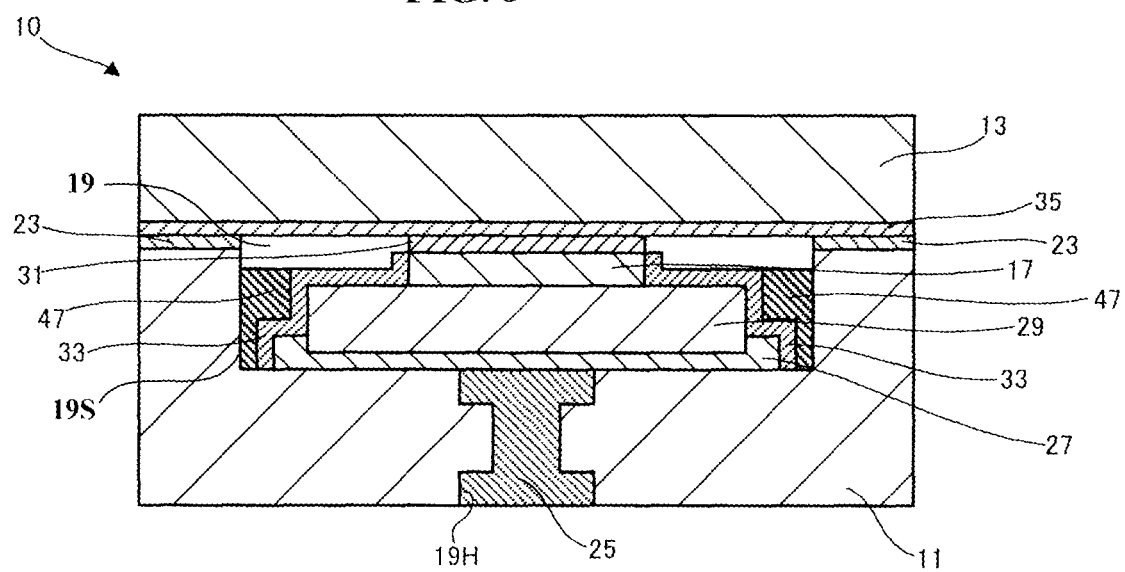
FIG. 8 is an enlarged cross-sectional view taken along Line 4-4 shown in FIG. 1 depicting a fourth exemplary variation of the laser light-emitting apparatus of FIG. 1.
Figure 9A:
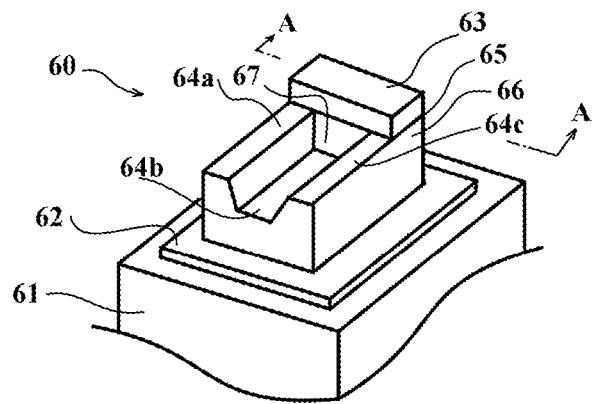
FIG. 9a is a schematic enlarged perspective view showing a first conventional laser light-emitting device.
Figure 9B:
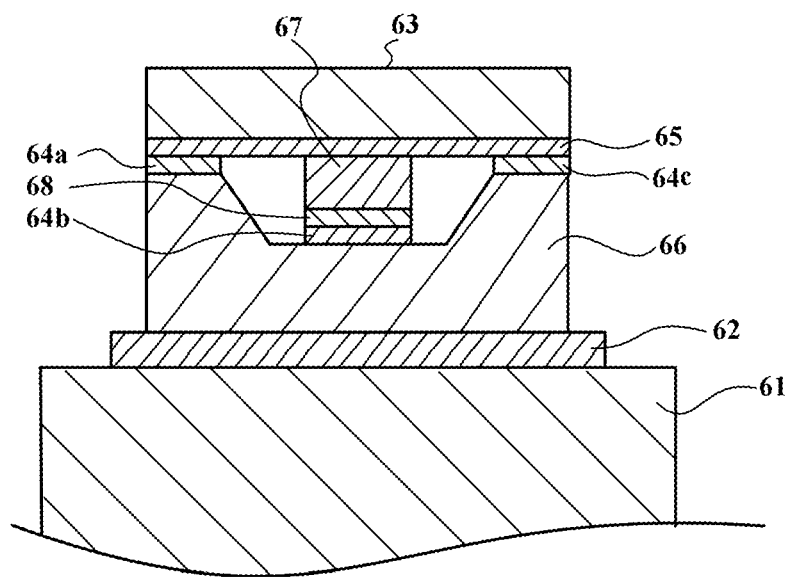
FIG. 9b is a schematic enlarged cross-sectional view taken along Line A-A shown in FIG. 9a showing the first conventional laser light-emitting device.
Figure 10A:
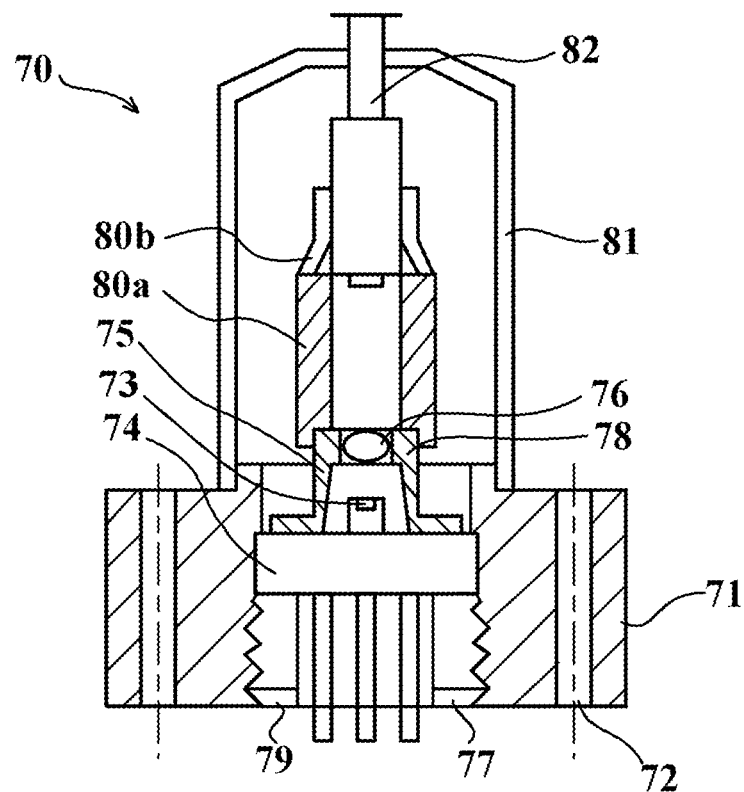
FIG. 10a is a schematic enlarged cross-sectional front view showing a second conventional laser light-emitting device.
Figure 10B:
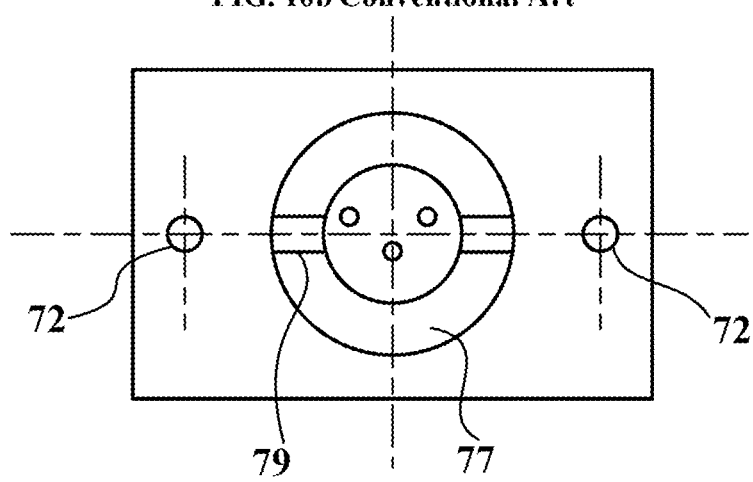
Figure 11A:
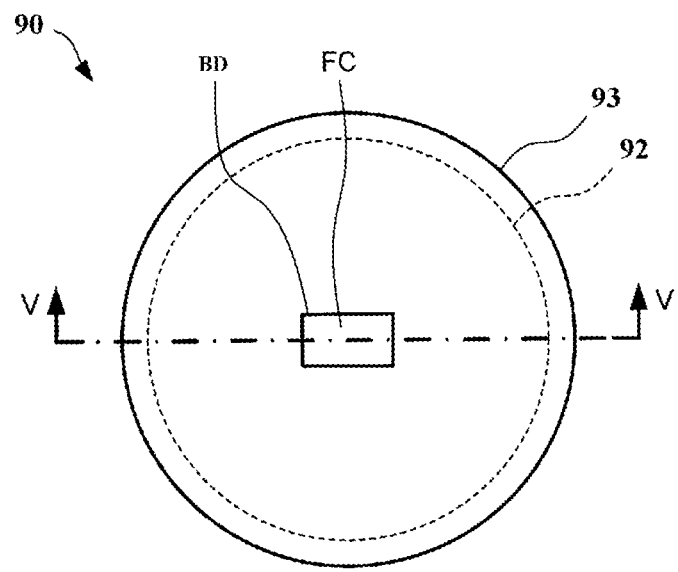
FIG. 11a is a schematic enlarged top view depicting a conventional laser light-emitting apparatus.
Figure 11B:
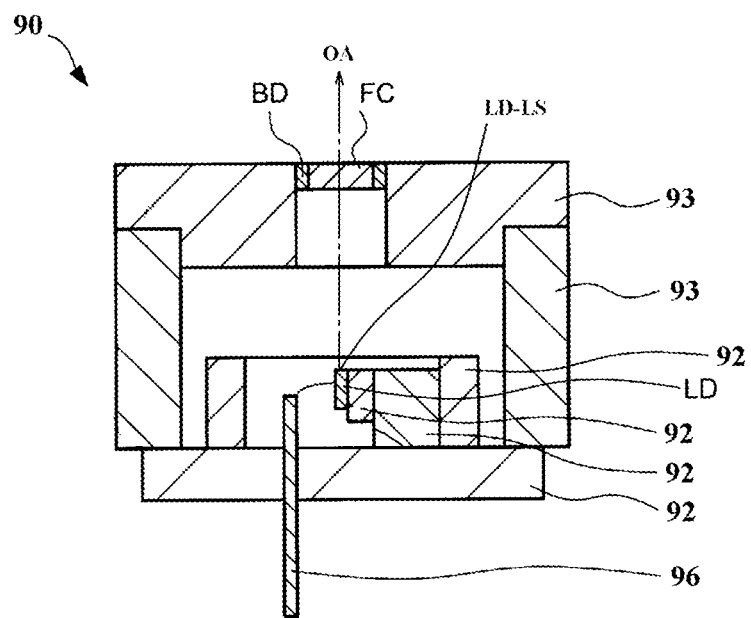
FIG. 11b is a schematic enlarged cross-sectional view taken along Line v-v shown in FIG. 11a depicting the conventional laser light-emitting apparatus, which may emit various color lights including a substantially white color light.

A fourth exemplary variation of the embodiment of the laser light-emitting apparatus 10 will now be described with reference to FIG. 8, which is an enlarged cross-sectional view taken along Line 4-4 shown in FIG. 1 depicting the fourth exemplary variation. In the laser light-emitting apparatus of FIG. 1, the isolating layer 33 can be disposed from the top contacting surface of the bottom contacting material 27 toward the laser side surface of the laser chip 17 via the sub side surface and the sub top surface of the sub mount 29, which are located in a direction toward at least the first external electrode 21 on the first base board 11 so that the light-emitting surface ER of the laser chip 17 is exposed from the isolating layer 33 as described above.

In the fourth variation, a thermal conductive material 47, which is made from a resin including a metallic filler such as a metallic particle of Ti, etc. can be disposed between the isolating layer 33 and the cavity side surface 19S of the cavity 19. Additionally, the second base board 13 can also include an electric conductive material such as a metal. Thereby, a heat generated from the laser chip 17 can efficiently radiate from the second base board 13, and also can radiate from the first base board 11 via the thermal conductive material 47, the sub mount 29 and the bottom contacting material 27. Therefore, the laser light-emitting apparatus 10 of the forth variation can further improve a reliability.

As described above, the wavelength converting board 15 can be located at a substantially right angle with respect to the cavity bottom surface 19 of the first base board 11, and therefore can efficiently receive the laser beam emitted from the laser light-emitting surface ER of the laser chip 17 at a substantially right angle with respect to the wavelength converting board 15. Additionally, the laser beam can be diffused by the light-diffusing plate 15B, and can be entered into the phosphor plate 15A. Therefore, the laser light-emitting apparatus 10 can emits the mixture light including a substantially white color light having favorable optical characteristics such as a high uniform color tone, a high light-emitting intensity, a small light-emitting spot, which can be used for lighting units such as a vehicle headlight that controls light emitted from the laser light-emitting apparatus 10 using a reflector and/or a projector lens.

In addition, the manufacturing method need not to include a complex process such as a wire bonding, and each of the first chip electrode 17E1 and the second chip electrode 17E2 of the laser chip 17 can automatically be connected to the first external electrode 21 exposed from the first top surface 11 T of first base board 11 and the second external electrode 25 exposed from the first bottom surface 11B of the first base board 11 in the manufacturing processes. Therefore, the disclosed subject matter can provide the reliable laser light-emitting apparatuses having favorable optical characteristics and a high workability.

Moreover, the heats generated from the laser chip 17 and the wavelength converting board 15 can efficiently radiate from the second base board 13, and also can radiate from the first base board 11 via the thermal conductive material 47, the sub mount 29 and the bottom contacting material 27. The laser chip 17 can be sealed by the first base board 11, the second base board 13 and the wavelength converting board 15. Thus, the disclosed subject matter can provide the laser light-emitting apparatuses having the favorable optical characteristics and a high reliability, which can be used for lighting units such as a vehicle headlight under the tough environments.

Furthermore, the laser light-emitting apparatuses can also emit various colored lights by combining the above-described laser chip 17 with the wavelength converting board 15 including at least one phosphor, and therefore can also be used as a light source device for various applications such as general lighting, a street light, stage lighting, traffic lights and the like using a small and simple optical member. In addition, it is conceived that each of the different aspects and features of the different embodiments disclosed herein could be used interchangeably in and with the other disclosed embodiments. For example, it is contemplated that any different color chip or different wavelength material can be used in any of the disclosed embodiments and in any combination. Moreover, an optical fiber can also be incorporated into the opening 11 of the first base board 11.

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art references described above are hereby incorporated in their entireties by reference.

What is claimed is:
1. A laser light-emitting apparatus comprising:
a laser chip having a first chip electrode, a second chip electrode and a light-emitting surface, and including a top contact material, the top contact material being electrically connected to the second chip electrode, and being exposed from the laser chip in an opposite direction of the first chip electrode;

a first base board having a first top surface, a first side surface, a first bottom surface, an opening and a cavity made from an insulating material, the cavity having a cavity bottom surface and a cavity side surface connecting the opening of the first base board, being concaved from the first top surface of the first base board toward the cavity bottom surface via the cavity side surface, and mounting the laser chip on the cavity bottom surface via a sub mount, and the opening of the first base board facing the light-emitting surface of the laser chip with respect to each other;

a second external electrode extending from the cavity bottom surface of the cavity toward the first bottom surface of the first base board, being exposed from the cavity bottom surface of the first base board, being electrically connected to the first chip electrode of the laser chip via the sub mount, and exposed from the first bottom surface of the first base board;

a first external electrode having a first thickness formed in a substantially planar shape on the first top surface of the first base board, and located in an opposite direction of the opening of the first base board;

a contact layer having a substantially same thickness as the first thickness of the first external electrode being located adjacent the first external electrode on the first top surface of the first base board, and surrounding the cavity and the opening on the first top surface of the first base board;

a second base board having a second side surface and a second bottom surface, including a second electrode underneath the second bottom surface of the second base board, and the second electrode of the second base board connecting the top contact material of the laser chip and the first external electrode and the contact layer, which are located on the first top surface of the first base board, and thereby the second base board covering the cavity and at least a part of the opening of the first base board;

an inserting concave portion including at least one of the first base board and the second base board, and located adjacent the cavity and the opening of the first base board; and a wavelength converting board being inserted into the inserting concave portion, which is concave toward the at least one of the first base board and the second base board, the wavelength converting board attached between the first base board and the second base board, and located in substantially parallel with each of the first side surface of the first base board and the second side surface of the second base board, wherein the laser chip is substantially sealed by the wavelength converting board, the first base board and the second base board.

2. The laser light-emitting apparatus according to claim 1, further comprising:

an isolating layer disposed from the bottom contacting material toward the laser chip via the sub mount, located in a direction toward at least the first external electrode on the first base board, and covering at least parts of the laser chip and the sub mount, wherein the light-emitting surface of the laser chip is exposed from the isolating layer.

3. The laser light-emitting apparatus according to claim 2, further comprising:

a thermal conductive material disposed between the isolating layer and the cavity side surface of the cavity.

4. The laser light-emitting apparatus according to claim 1, wherein the wavelength converting board includes a phosphor plate formed in a substantially tabular shape and a light-diffusing plate formed in a substantially tabular shape, and wherein an adhesive material is disposed between each of inner peripheral regions of the phosphor plate and the light-diffusing plate and thereby the adhesive material attaching the phosphor plate to the light-diffusing plate on each of the inner peripheral regions, and a wavelength connecting layer is disposed on each of outer peripheral regions of the phosphor plate and the light-diffusing plate, which is located in an opposite direction of each of the inner peripheral regions of the phosphor plate and the light-diffusing plate, respectively.

5. The laser light-emitting apparatus according to claim 1, wherein the wavelength converting board includes a phosphor plate formed in a substantially tabular shape and a light-diffusing plate formed in a substantially tabular shape, wherein a multi-contacting-layer is disposed between each of inner peripheral regions of the phosphor plate and the light-diffusing plate and thereby the multi-contacting-layer attaching the phosphor plate to the light-diffusing plate on each of the inner peripheral regions, and a multi-connecting-layer is disposed on each of outer peripheral regions of the phosphor plate and the light-diffusing plate, which is located in an opposite direction of each of the inner peripheral regions of the phosphor plate and the light-diffusing plate, respectively.

6. The laser light-emitting apparatus according to claim 5, wherein the multi-contacting-layer includes a first light-reflecting layer and a first contact-contributing layer, and the multi-connecting-layer includes a second light-reflecting layer and a second contact-contributing layer, and wherein the first light-reflecting layer contacts each of the inner peripheral regions of the phosphor plate and the light-diffusing plate, and the second light-reflecting layer contacts each of the outer peripheral regions of the phosphor plate and the light-diffusing plate.

7. The laser light-emitting apparatus according to claim 6, wherein the first light-reflecting layer is a laminated film of titanium (Ti) and silver (Ag), and the first contact-contributing layer is a laminated film in order of nickel (Ni), platinum (Pt) and gold (Au), and wherein the second light-reflecting layer is a laminated film in order of Ti and Ag, and the second contact-contributing layer is a laminated film in order of Ni, Pt, Au and gold-tin (AuSn).

8. The laser light-emitting apparatus according to claim 1, wherein the phosphor plate of the wavelength converting board includes at least one of an yellow phosphor, a red phosphor, a green phosphor and a blue phosphor.

9. The laser light-emitting apparatus according to claim 1, wherein a semiconductor laser diode emitting blue light is used as the laser chip, and Yttrium aluminum garnet (YAG) phosphor ceramic is used as the phosphor plate of the wavelength converting board.

10. The laser light-emitting apparatus according to claim 1, wherein the laser chip is a laser diode emitting ultraviolet laser beam, and the phosphor plate of the wavelength converting board includes at least one of an yellow phosphor, a red phosphor, a green phosphor and a blue phosphor.

* * * * *